United States Patent [19]
Ahrens et al.

[11] Patent Number: 5,041,393
[45] Date of Patent: Aug. 20, 1991

[54] FABRICATION OF GAAS INTEGRATED CIRCUITS

[75] Inventors: Richard E. Ahrens, Muhlenberg Township, Berks County; Albert G. Baca, Reading; Randolph H. Burton, Amity Township, Berks County; Michael P. Iannuzzi, Robeson Township, Berks County; Alex Lahav, South Whitehall Township, Lehigh County, all of Pa.; Shin-Shem Pei, New Providence Township, Union County, N.J.; Claude L. Reynolds, Jr., Spring Township, Berks County; Thi-Hong-Ha Vuong, Wyomissing Hills Township, Berks County, both of Pa.

[73] Assignee: AT&T Bell Laboratories, Murray Hill, N.J.

[21] Appl. No.: 290,932

[22] Filed: Dec. 28, 1988

[51] Int. Cl.$^5$ .......................... H01L 21/70
[52] U.S. Cl. .................. 437/58; 148/DIG. 72; 357/16; 437/39; 437/40; 437/133; 437/176; 437/912
[58] Field of Search ............ 148/DIG. 3, 50, 51, 148/56, 65, 72, 82, 97, 110, 139, 140, 164, 169, 33, 33.1, 33.4; 156/610–614; 357/16, 22 A, 22 MD, 23.21, 23.12, 41, 42, 47, 55, 56; 437/22, 34, 38, 39, 41, 51, 56–59, 63, 64, 66, 67, 81, 89, 90, 105, 107, 110, 126, 133, 176, 195, 912, 915, 974

[56] References Cited

U.S. PATENT DOCUMENTS

| | | | |
|---|---|---|---|
| 4,163,237 | 7/1979 | Dingle et al. | 357/16 |
| 4,194,935 | 3/1980 | Dingle et al. | 156/612 |
| 4,615,102 | 10/1986 | Suzuki et al. | 437/58 |
| 4,733,283 | 3/1988 | Kuroda | 357/22 |
| 4,742,379 | 5/1988 | Yamashita et al. | 357/22 |
| 4,771,013 | 9/1988 | Curran | 437/110 |
| 4,837,178 | 6/1989 | Ohshima et al. | 437/67 |
| 4,860,064 | 8/1989 | Luryi | 357/16 |
| 4,873,558 | 10/1989 | Antreasyan et al. | 357/23.2 |

FOREIGN PATENT DOCUMENTS 0119089 12/1984 European Pat. Off. .
0175437 4/1985 European Pat. Off. .
(List continued on next page.)

OTHER PUBLICATIONS

Ghandi, *VL340104 I Fabrication Principles,* John Wiley & Sons, New York, 1983, pp. 603–605.
(List continued on next page.)

Primary Examiner—Olik Chaudhuri
Assistant Examiner—William Bunch
Attorney, Agent, or Firm—S. W. McLellan

[57] ABSTRACT

A process for manufacturing selectively doped heterostructure field-effect transistors (SDHTs), a desired wafer structure for SDHT fabrication and a method for isolating SDHTs on the wafer are disclosed herein. The wafer has epitaxial layers grown on a substrate. The layers are: a buffer layer of GaAs, a first spacer layer of AlGaAs, a donor layer of AlGaAs, a second spacer layer of AlGaAs, a first cap layer of GaAs, an etch-stop layer of AlGaAs and a second cap layer of GaAs. A protective layer of AlGaAs may then be grown on the second cap layer to protect the second cap layer from contamination or damage. Also a superlattice may first be grown on the substrate. Openings are made in the protective layer and then in the second cap layer where enhancement type SDHTs are to be formed. The remaining protective layer is then etched along with the exposed etch-stop layer with a selective etch to expose the first cap layer and the second cap layer where respective enhancement-type SDHTs and depletion-type SDHTs are to be formed. Gate electrodes for corresponding SDHTs are then formed on the exposed first and second cap layers and a subsequent selective dopant implant forms self-aligned SDHT structures. Multiple layers of dielectric and metal are then deposited to interconnect the SDHTs. The selective etch of the AlGaAs protective layer and the etch-stop layer results in consistent threshold voltages of the SDHTs across the wafer. The isolation of SDHTs is accomplished in a two step isolation involving implanting isolation dopant (e.g., oxygen) into the epitaxial layers.

31 Claims, 8 Drawing Sheets

FOREIGN PATENT DOCUMENTS

| | | |
|---|---|---|
| 0233725 | 8/1987 | European Pat. Off. ............ 437/59 |
| 0076547 | 6/1981 | Japan ................................. 437/59 |
| 0301568 | 12/1988 | Japan ................................. 437/59 |

OTHER PUBLICATIONS

Sze, *VLSI Technology*, McGraw-Hill Book Company, New York, 1983, pp. 461-463.

*IEEE Electron Device Letters*, vol. EDL-8, No. 3, Mar. 1987, pp. 121-123, New York, U.S.; H. Schichijo et al.: "GaAs E/D MESFET 1-kbit static RAM Fabricated on Silicon Substrate".

*Nuclear Instruments & Methods in Physics Research*, vols. 209/210, part II, May 1983, pp. 657-661, North-Holland Publishing Co., Amsterdam, NL, X.-C. Deng: "Oxygen ion beam modification of GaAs".

*Journal of Electrochemical Society*, vol. 135, No. 11, Nov. 1988, pp. 2835-2840; K. T. Short et al.; "Implant Isolation of GaAs".

"Low-Noise HEMT Using MOCVD", *IEEE Transactions on Microwave Theory and Techniques, 1 MIT-34 (1986) Dec., No. 12, New York, NY U.S.A.*, K. Tanaka, M. Ogawa, K. Togashi, H. Takakuwa, H. Ohke, M. Kanazawa, Y. Kato, S. Watanabe, *pp. 1522-1527.*

"Modulation-doped FET Threshold Voltage Uniformity of a High Throughput 3 Inch MBE Systems", J. Vac. Sci. Technol, B2 (2), Apr.-Jun. 1984, pp. 252 through 255.

"A Self-Aligned Gate Modulation-Doped (Al, Ga)As/GaAs FET IC Process", *GaAs IC Symposium*, N. C. Cirillo, Jr., J. K. Abrokwah, and S. A. Jamison, 1984, pp. 167 through 170.

"Self-Aligned Modulation-Doped (Al,Ga) As/GaAs Field-Effect Transistors", N. C. Cirillo, Jr., J. K. Abrokwah, M. S. Shur, *IEEE Electron Device Letters, vol. EDL-5, No. 4, Apr. 1984, pp. 129 through 131.*

"The Effect of Annealing on the Electrical Properties of Selectively Doped GaAs/N-AlGaAs Heterojunction Structures Grown by MBE", Ishikawa, Hiyamizu, Mimura, Saito, Hashimoto, *Japanese Journal of Applied Physics*, vol. 20, No. 11, Nov. 1981, pp. L814-L816.

FABRICATION OF GAAS INTEGRATED CIRCUITS

This invention was made with Government support under contract No. F29601-87-R-0202 awarded by the Defense Advanced Research Projects Agency, and under contract No. F33615-84-C-1570 awarded by the Air Force Wright Aeronautical Laboratories. The Government has certain rights in this invention.

RELATED APPLICATIONS

This application is being filed simultaneously with an application titled "Method for Selectively Etching Aluminum Gallium Arsenide" by F. Ren et al. and assigned to the same assignee as this invention.

FIELD OF THE INVENTION

This invention relates generally to the manufacture of compound semiconductor integrated circuits, and more specifically, to the process of manufacturing gallium arsenide heterojunction field-effect transistors in an integrated circuit.

BACKGROUND OF THE INVENTION

A selectively doped heterostructure transistor, SDHT, (also known as a MODFET for modulation doped FET, a TEGFET for two-dimensional electron gas FET, or a HEMT for high electron mobility transistor, and will be referred to generically, for purposes here, as a heterojunction field-effect transistor, or HFET) has superior performance compared to conventional (non-heterojunction) metalsemiconductor FETs (MESFET) in bandwidth and noise figure, etc. For example, see U.S. Pat. No. 4,163,237 by Dingle et al. and assigned to the same assignee as this invention. One drawback to using HFETs is the difficulty in the formation thereof in integrated form with consistent device characteristics across a wafer, even across a single chip. For example, the threshold voltage of HFETs can vary so much in a single chip that logic circuits built using HFETs do not operate reliably, reducing the yield of operable circuits from a wafer.

A simple process for the manufacture of HFETs in compound semiconductor integrated circuits has been a goal of many manufacturers to increase the yield and produce high performance, low cost ICs. One such process is described in U.S. Pat. No. 4,194,935 and assigned to the assignee of this invention. However, no provision is made for manufacturing both depletion and enhancement types of HFETs.

Another HFET manufacturing process is described in U.S. Pat. No. 4,615,102. Here, both enhancement and depletion HFETs are provided for but the threshold voltages of the HFETs are very difficult to make uniform, particularly the threshold voltage of the enhancement HFETs. Further, the resulting structure is very uneven, making metalization difficult and unreliable where the metal thins out over sharp changes in topography.

SUMMARY OF THE INVENTION

A new process has been invented for the manufacture of both enhancement and depletion HFETs in integrated form with consistent threshold voltages across a wafer and a self-aligned structure. In one embodiment, these advantages have been achieved generally by growing a buffer layer of compound semiconductor material with a first bandgap energy; growing a first spacer layer of compound semiconductor material with a second bandgap energy; growing a donor layer of doped compound semiconductor material with the second bandgap energy; growing a first cap layer of compound semiconductor material with the first bandgap energy; growing an etch-stop layer of compound semiconductor material with a third bandgap energy; and, growing a second cap layer of compound semiconductor material with the first bandgap energy. The second and third bandgap energies are more than the first bandgap energy. The layers are preferably grown by a molecular beam epitaxy process to achieve precise control over the thickness of the layers.

A further embodiment, which generally achieves the above advantages and utilizes the epitaxial layer formed by the layers discussed above, involves isolating selected regions of the epitaxial layer; etching portions of the selected regions of the epitaxial layer to a predetermined depth where enhancement FETs are to be formed; forming gate electrodes for both enhancement and depletion FETs; forming source/drain regions for the drain and source electrodes of the enhancement and depletion FETs; contacting the source/drain regions, depositing a dielectric layer; selectively etching the dielectric for vias, forming an interconnect layer; and passivating the resulting structure. The steps of depositing a dielectric layer, selectively etching the dielectric layer for vias and forming an interconnect layer may be repeated for each desired layer of interconnect.

The precise control over the thicknesses of the layers and the precision etching thereof ensures uniformity in the threshold voltages of the HFETs. The etch-stop layer allows for precision etching of the wafer where enhancement HFETs are to be formed. In addition, the resulting HFET structures are substantially planar, allowing for reliable metalization of the wafer.

The method of isolating devices on the wafer is achieved generally by selectively implanting isolation dopant onto the wafer a predetermined depth into the epitaxial layer where conductivity therein is to be reduced; annealing the wafer at a predetermined temperature; selectively implanting isolation dopant into the wafer completely through the epitaxial layer into the substrate; and annealing the wafer a second time at a temperature less than the predetermined temperature.

BRIEF DESCRIPTION OF THE DRAWING

The foregoing features of this invention, as well as the invention itself, may be more fully understood from the following detailed description of the drawings representing one embodiment of the invention, in which.

It is understood that none of the figures are to scale.

DETAILED DESCRIPTION

Although the compound semiconductor material referred to here is based on gallium arsenide (GaAs) and aluminum gallium arsenide (AlGaAs), other compound semiconductor materials could be substituted, such as indium aluminum arsenide (InAlAs) and indium gallium arsenide (InGaAs), respectively. The concentration (i.e., mole fraction) of aluminum in the AlGaAs is usually identified as x in $Al_xGa_{1-x}As$, where x can range from 0 (0%, or no aluminum) to 1 (100% aluminum, or no gallium), depending on the bandgap energy required of the material. Generally, the more the aluminum, the higher the bandgap energy of the AlGaAs material. For purposes here, gallium arsenide will be identified as GaAs and aluminum gallium arsenide will be identified as AlGaAs. The concentration of aluminum in AlGaAs will be designated by percentage of aluminum therein.

Figure 1:
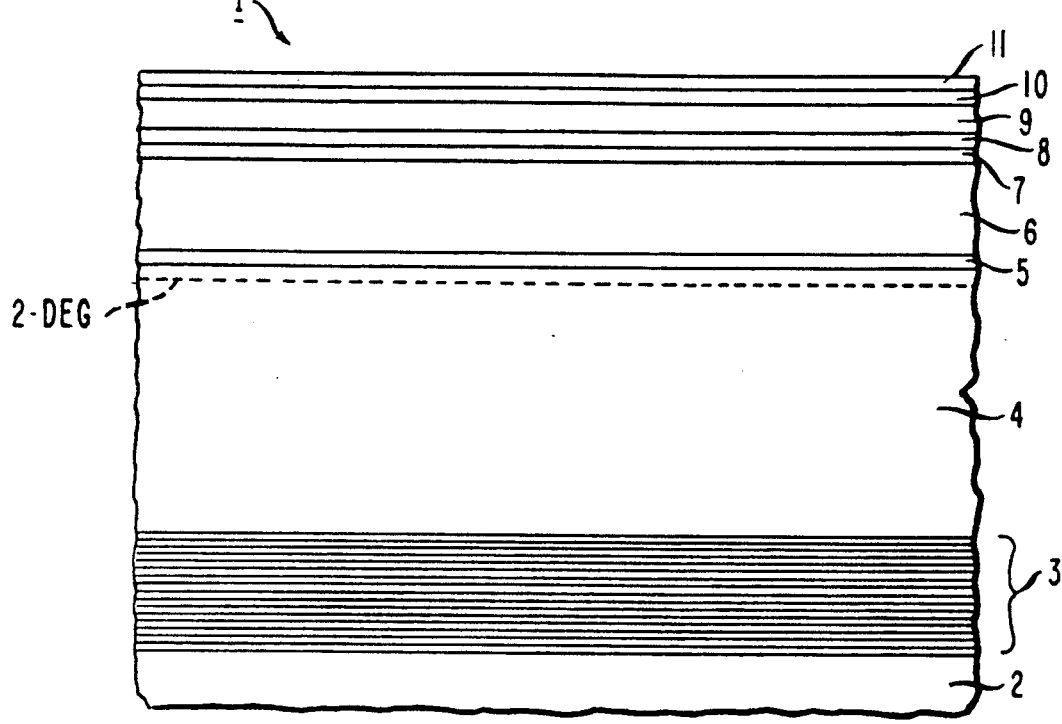
FIG. 1 is a cross-section view of a substrate with multiple layers grown thereon.

Referring to FIG. 1, a partial cross-sectional view (not to scale) of a wafer 1 ready for the manufacturing of both enhancement and depletion selectively doped heterojunction field-effect transistors (hereinafter referred to as E-HFET and D-HFET, respectively) is shown. Although not described in detail here, layers 3 through 11 (of which layers 4 through 10 are here referred to collectively as an epitaxial layer, layer 11 being a temporary layer) are grown on a semi-insulating GaAs substrate 2 in a molecular beam epitaxy (MBE) machine, forming an essentially continuous layer from the substrate 2. One such MBE machine capable of growing GaAs and AlGaAs layers is a Varian Gen II, manufactured by Varian Associates of Santa Clara, Calif. However, it is possible to grow GaAs and AlGaAs layers by metal-organic chemical vapor deposition (MOCVD) or by metal-organic or gas source MBE. Layer 3 contains therein multiple alternating layers of GaAs and AlGaAs to form a superlattice which reduces the likelihood that impurities and defects will propagate from the substrate 2 into higher layers 4 through 10. This superlattice reduces the need for a thicker buffer layer 4, decreasing the time necessary for the growth of the epitaxial layer. There is preferably more than ten of such alternating layers in layer 3, each AlGaAs layer having an acceptable aluminum concentration of 10% to 60%. Each of the alternating layers has a thickness less than an electron or hole wave function, e.g., 4 nanometers or less. Using an exemplary aluminum concentration of 22%, it has been found that ten alternating layers, or periods, is sufficient. This results in the overall thickness of the layer 3 of approximately 80 nanometers.

Over the superlattice (layer 3), a buffer layer 4 of undoped GaAs is deposited having a typical thickness range of approximately 10 to 1000 nanometers, preferably 300 nanometers. As will be explained below, the buffer layer 4 supports a two-dimensional electron gas (2-DEG), which is the channel, or active region, of the E-HFETs and D-HFETs. It is in the channel that current flows between the drain and source electrodes of corresponding E-HFETs and D-HFETs.

A first spacer layer 5 is deposited over the buffer layer 4, a donor layer 6 is deposited on the spacer layer 5, and a second spacer layer 7 is deposited over the donor layer. The first and second spacer and donor layers 5, 7, 6 are of AlGaAs. However, the donor layer 6 is doped, and as will be explained in more detail below, the doping concentration strongly influences the threshold voltages of the D-HFETs and E-HFETs. To assure full depletion of the donor layer 6 under zero bias conditions for an E-HFET, the donor layer should be less than 30 nanometers thick. Further, the acceptable uniform concentration of aluminum in the donor layer 6 and the spacer layers 5, 7 ranges from 10% to 60% and is preferably 22%. The dopant used is preferably silicon, but other dopants, such as selenium, could be used to make the conductivity of the layer 6 N-type. The same dopant is used for implants where N-type conductivity regions are desired in the wafer 1. The doping density in the donor layer 6, prior to a subsequent wafer anneal step, ranges from $5 \times 10^{17}$ to $2 \times 10^{18}$ atoms $cm^{-3}$ and is preferably $6 \times 10^{17}$ atoms $cm^{-3}$. Equivalently, beryllium, carbon or other suitable species could be used to make the conductivity of layer 6 P-type. As will be discussed in more detail below, the first spacer layer 5 enhances the electron mobility of the 2-DEG by confining the 2-DEG to the buffer layer 4, thereby reducing scattering of the 2-DEG by impurities in layers 5 and 6 and in the interface between layers 4 and 5, increasing the mobility 2-DEG. The second spacer layer 7, along with the first spacer layer 5, functions to absorb out-diffusion of dopant from the donor layer 6 during later high-temperature processing, such as annealing. The thickness of the spacer layer 5 is a trade-off between the transconductance of the desired E-HFET or D-HFET and the desired increase in mobility of the electrons in the 2-DEG, resulting in a thickness ranging from 1 to 5 nanometers, with approximately 2.5 nanometers as an acceptable compromise after a wafer annealing step, as discussed in more detail below. Likewise, the thickness of the second spacer layer 7 is similar to that for the first spacer layer 5. However, the primary purpose of the second layer 7 is to absorb dopant from the donor layer 6 and prevent the dopant from reaching an upper layer and may have virtually no thickness after the anneal. In contrast, the first spacer layer 5 must be thick enough to properly confine the 2-DEG to the buffer layer 4. Hence, the thickness of the second spacer layer 7 can be somewhat less than the thickness of the first spacer layer 5.

First and second cap layers 8, 10 are undoped GaAs layers used for forming thereon Schottky barrier gate contacts and ohmic drain and source contacts for E-HFETs and D-HFETs, respectively, as will be discussed in more detail below. The cap layers 8, 10 are approximately 10 nanometers thick. Undoped AlGaAs etch-stop layer 9, disposed between cap layers 8, 10 and approximately 30 nanometers thick, acts as an etch-stop for E-HFET etching, also described in more detail below. The aluminum concentration in the etch-stop layer 9 ranges from 10% to 60% and is preferably 50%.

Last, a protective layer 11 of AlGaAs is deposited, having a aluminum concentration substantially the same as the etch-stop layer 9 and a thickness of about that of cap layers 8, 10. As will be described in more detail below, layer 11 is sacrificed to protect the wafer 1 from contamination or damage before a final etch and the deposition of metal to form the gates.

The doping of the donor layer 6 and the distance the gates of the corresponding E-HFETs and D-HFETs are from the 2-DEG layer establishes the threshold voltages of the E-HFET and the D-HFETs. As will be discussed below, the corresponding distances are set by the thicknesses of the layers 5-10 for the D-HFETs and layers 5-8 for the E-HFETs. So critical are thickness of the layers 5-10 that for one tenth nanometer of error the threshold voltage of a D-HFET shifts approximately two to five millivolts and of an E-HFET shifts approximately two millivolts. Hence, once the desired characteristics of the E-HFETs and D-HFETs are determined and the doping density of donor layer 6 is set, the thicknesses of the layers 5-10 are calculated. Using the after-anneal doping densities given above for donor layer 6, for an exemplary E-HFET having a threshold voltage of 0.2 volts, the combined thickness of layers 5-8 is substantially 50 nanometers. Similarly, for an exemplary D-HFET with a threshold voltage of $-0.6$ volts, the combined thickness of layers 5-10 is substantially 100 nanometers.

As stated above, the epitaxial layer includes the buffer layer 4, first and second spacer layers 5, 7, donor layer 6, first and second cap layers 8, 10 and the etch-stop layer 9. The superlattice structure 3 and the protective layer 11 are used advantageously in cooperation with the rest of the layers 4-10, but are not an indispensable portion of the claimed invention. Further, the first and second spacer layers 5, 7 can be deleted from wafer 1 when fabricating MESFET devices, mentioned above.

Figure 2:
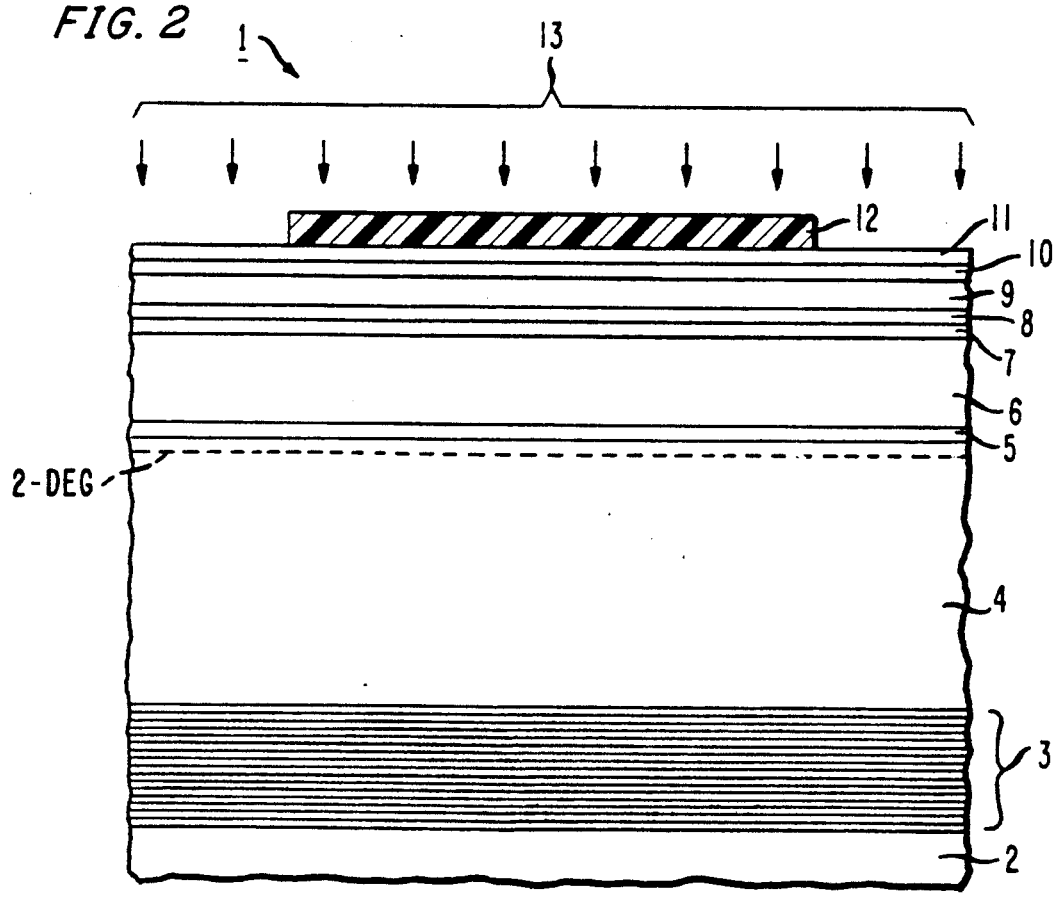
FIG. 2 is the structure of FIG. 1 undergoing shallow isolation implant.

After formation of the wafer 1, a shallow isolation of selected regions of the wafer is made. In FIG. 2, a layer of photoresist 12 (for example, Shipley AZ-1350J photoresist) is deposited and patterned, leaving exposed regions of the wafer 1 where an isolation well is to be formed. Typically, the entire wafer is exposed except where E-HFETs or D-HFETs are to be formed. An implant source (not shown) provides an isolation dopant 13, preferably ionized oxygen, which is driven into the wafer. Exemplary energy levels for the ionized oxygen range from 20 to 160 keV, with a dose of $5 \times 10^{12}$ to $1.5 \times 10^{14}$ oxygen ions cm$^{-2}$; the higher the energy, the deeper the implant. An exemplary implant is a dose of $1 \times 10^{14}$ ions cm$^{-2}$ at 40 keV then at 125 keV. The resulting peak concentration of oxygen atoms in the wafer 1 ranges from $5 \times 10^{18}$ to $1 \times 10^{19}$ atoms cm$^{-3}$. The implanted oxygen destroys the conductivity of the wafer where exposed to the implant, thereby isolating and reducing capacitive loading on devices later formed in the wafer 1. The resulting isolation regions 14 are formed, as shown in FIG. 3.

The photoresist layer 12 of FIG. 2 is then removed and another photoresist is deposited (not shown). This photoresist is patterned to expose the underlying wafer in regions of the wafer where E-HFETs are to be formed. The exposed protective layer 11 is then etched to the second cap layer 10 using an AlGaAs etchant described below. The second cap layer 10 is itself etched to expose the etch-stop layer 9. The photoresist (not shown) is then removed and the wafer thoroughly cleaned. The previously un-etched portion of protective layer 11 and the exposed etch-stop layer 9 are then simultaneously etched to expose the portions of the second cap layer 10 where D-HFETs are to be formed and the portions of the first cap layer 8 where E-HFETs are to be formed. This results in the structure substantially as shown in FIG. 3.

The etching of the second cap layer 10 (GaAs) to the etch-stop layer 9 is preferably by a wet etch of the wafer in a conventional potassium iodide/iodine (KI/I$_2$) solution until the GaAs is removed. Alternatively, a reactive ion etch could be used. Although the etch is selective, the over-etching of the GaAs second cap layer 10 into the AlGaAs etch-stop layer 9 is not critical. Advantageously, the over-etching of second cap layer 10 into the etch-stop layer 9 ensures complete removal of the second cap layer 10, resulting in a more uniform etch of etch-stop layer 9. It is noted, however, that the etching of the AlGaAs protective layer 11 to the second cap layer 10 and the etching of the etch-stop layer 9 to the first cap layer 8 are critical to the performance of the later formed D-HFETs and E-HFETs as stated above. This etching must be both effective in removing all of the exposed AlGaAs as well as very selective to avoid over-etching and reducing the thickness of the first cap layer 8 and the second cap layer 10. Details on the preferred etching process for selectively etching the AlGaAs layers 11 and 9 is given in the above-identified co-filed patent application by F. Ren et al. It is sufficient here to state that the wafer 1 is first cleaned with diluted (20:1 in water) ammonium hydroxide (NH$_4$OH), then etched with diluted (1:1 with water) hydrofluoric acid (HF) and again rinsed with diluted NH$_4$OH to achieve an etching selectivity of AlGaAs over GaAs of up to several hundred.

Figure 3:
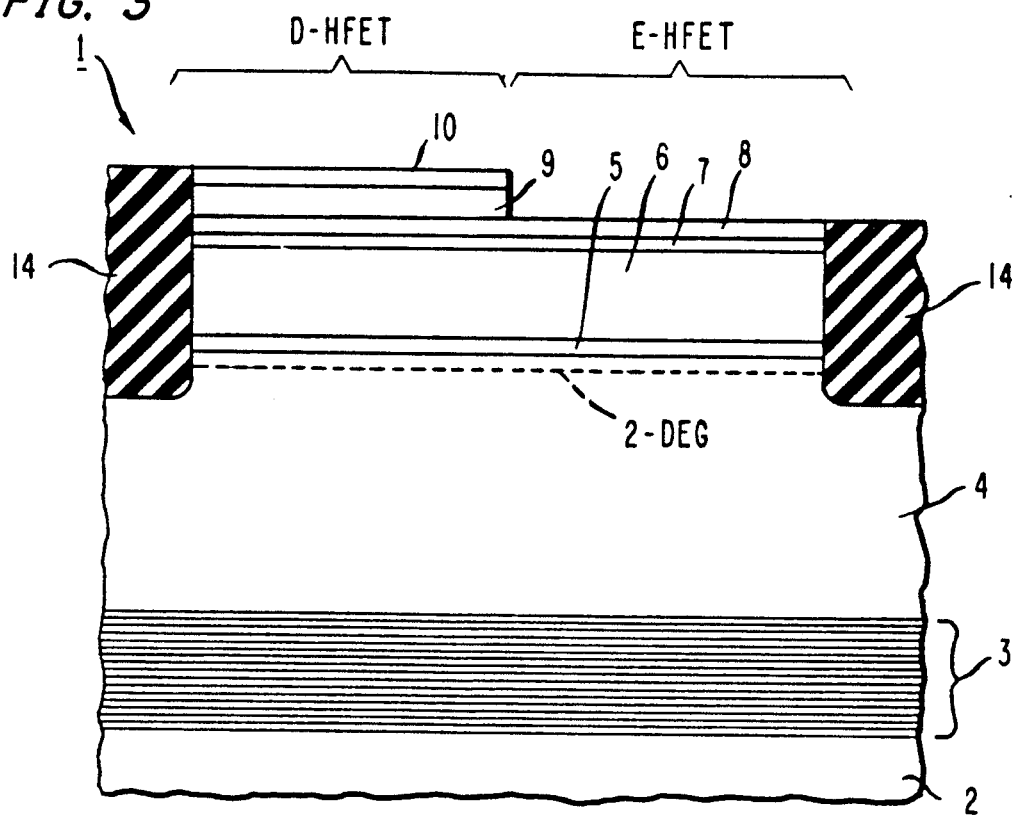
FIG. 3 is the structure of FIG. 2 after a selective etch.

After the etching of the protective layer 11 and the etch-stop layer 9, the structure shown in FIG. 3 results. The exposed first cap layer 8 will form the surface adjacent portions of the E-HFETs and the second cap layer 10 will form the surface adjacent portions of the D-HFETs. It is understood that the shallow isolation step discussed above can instead be done after the etching of layers 9, 10 and 11.

Figure 4:
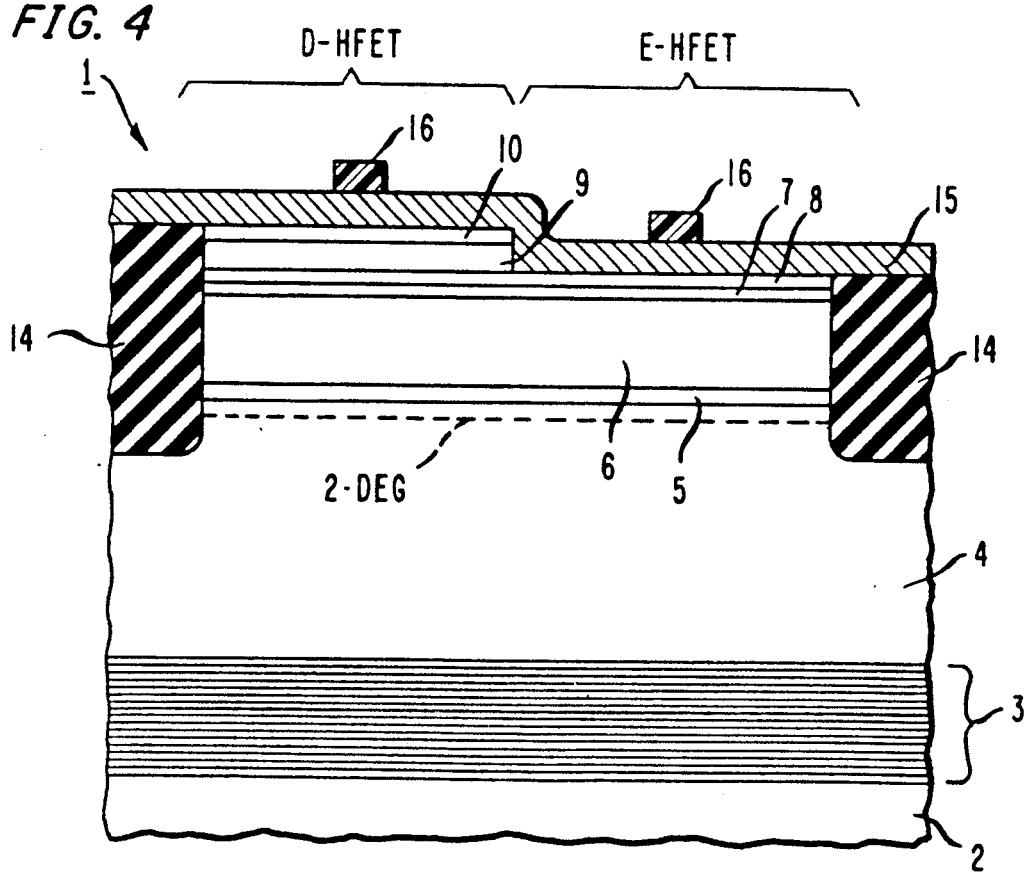
FIG. 4 is the structure of FIG. 3 with gate metal deposited and patterned photoresist thereon.

Next, in FIG. 4, a uniformly thick layer of refractory metal 15 is deposited onto the wafer to form the gates for the E-HFETs and D-HFETs. The preferred refectory metal for the gates is tungsten silicide (W$_1$Si$_{0.45}$) and is sputtered on. However, tungsten nitride (WN) or tungsten silicide nitride (WSiN) can be used. The W$_1$Si$_{0.45}$ has a high crystallization temperature (above 850° C.) and remains amorphous following a subsequent high temperature anneal step, thus serving as a barrier to the inter-diffusion of Ga, As, W, and Si. Further, to reduce the resistivity of subsequently formed gates, a layer of tungsten could be deposited over the corresponding type of silicide. A layer of photoresist is then deposited over the metal 15 and patterned, leaving photoresist 16 where the gates for the E-HFETs and D-HFETs are to be. The exposed metal 15 is then etched, preferably by a reactive ion etch (RIE) using nitrogen trifluoride (NF$_3$), sulphur hexafluoride (SF$_6$) or carbon tetrafluoride (CF$_4$), leaving metal 15 under the patterned photoresist 16.

Figure 5:
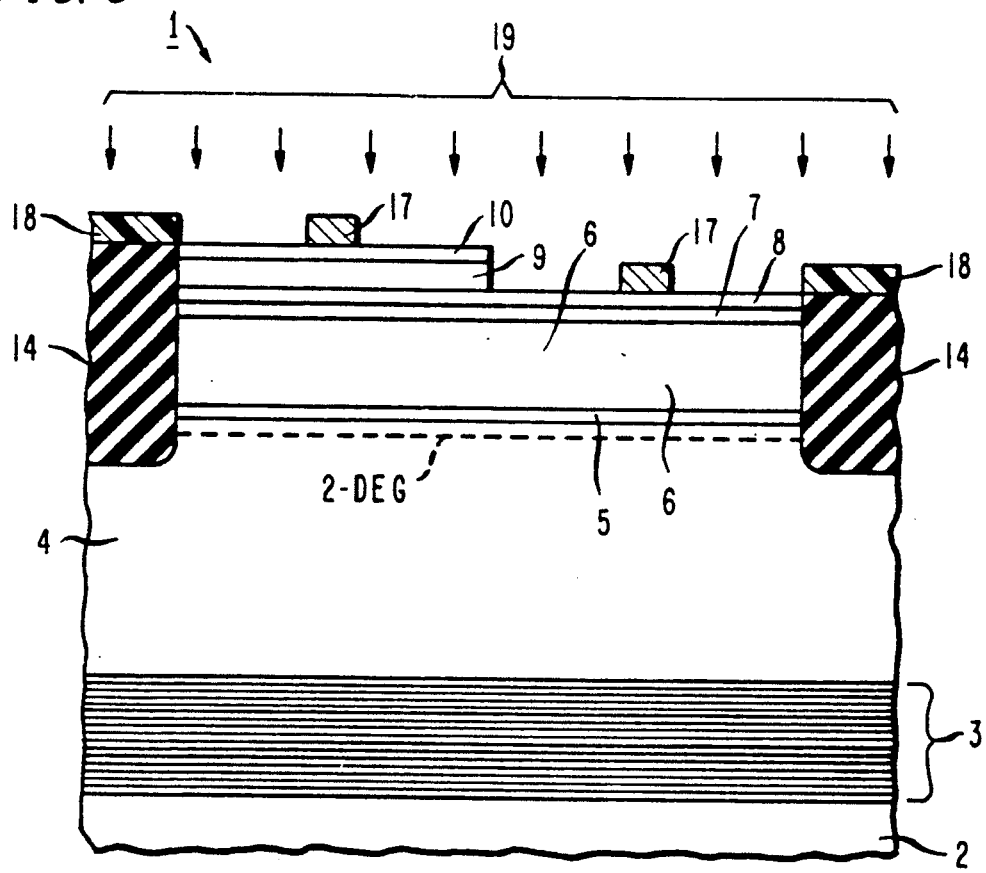
FIG. 5 is the structure of FIG. 4 with the gates for both enhancement and depletion HFETs in place and undergoing dopant implant.
Figure 6:
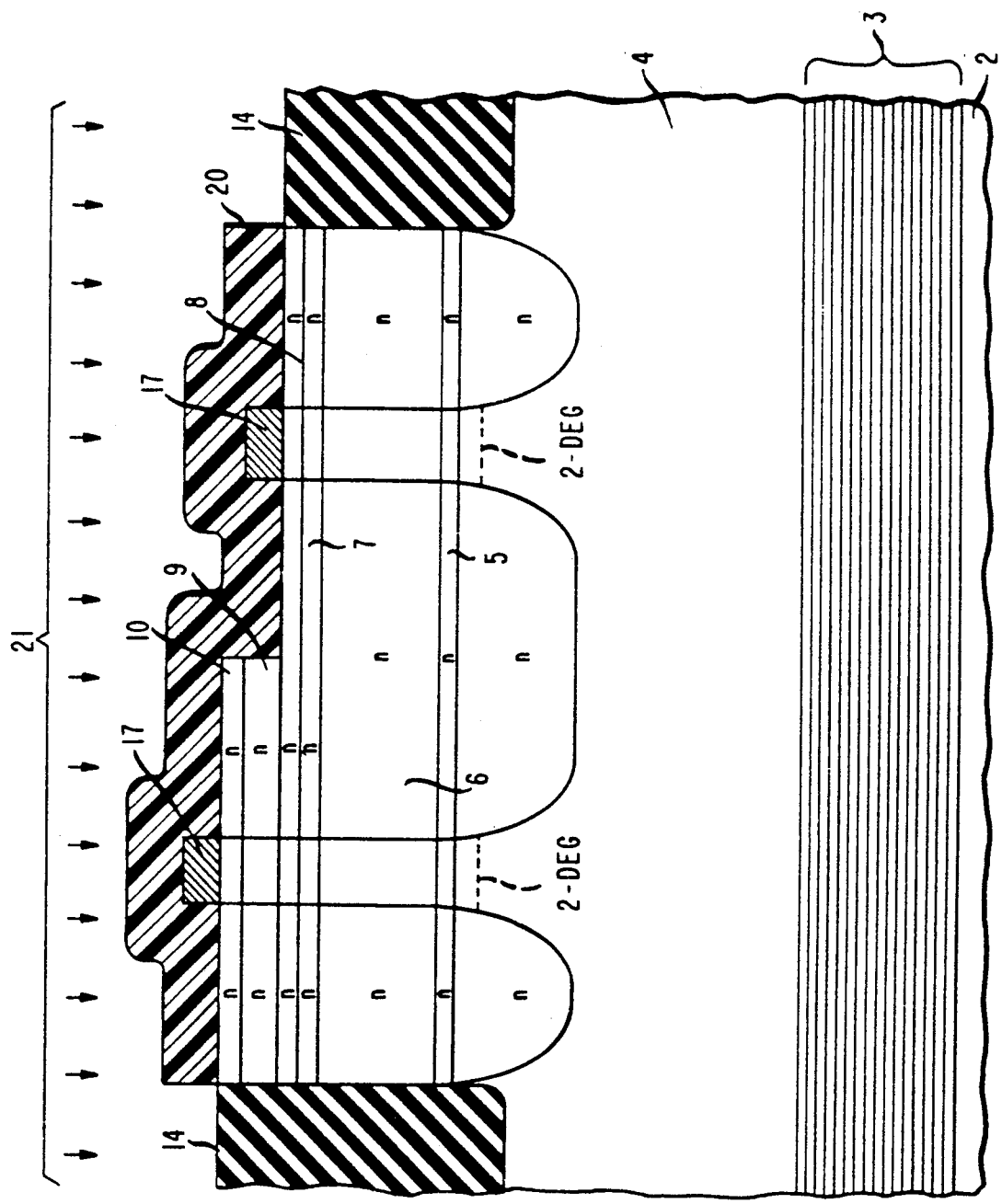
FIG. 6 is the structure of FIG. 5 after the implant of dopants to form the self-aligned HFET drain and source regions and undergoing a deep isolation implant.

The patterned photoresist 16 (FIG. 4) is then removed, leaving gates 17 in FIG. 5. Next, the source and drain regions of the E-HFETs and D-HFETs are to be formed by selectively implanting a dopant, here silicon, into the wafer to form N-type source and drain regions. First a layer of photoresist 18 is deposited and patterned to expose the portions of the wafer where it is desired to have the N-type regions formed. Shown here in FIG. 5, the patterned photoresist 18 covers the isolation regions 14, but the photoresist 18 may cover any area on the wafer. Next singly ionized silicon atoms 19, from an implant source (not shown), are implanted in the exposed wafer except where the photoresist 18 and gates 17 covers the wafer 1. This process results in a self-aligned structure as shown in FIG. 6. After the implant, the photoresist layer 18 (FIG. 5) is removed. The effect of the implanting of silicon into the wafer 1 is the converting of the implanted layers to n-type, which is signified by "n" in layers 4 though 10. The implanting of the silicon destroys the 2-DEG layer in the implanted regions of the buffer layer 4, leaving the 2-DEG only in the unimplanted regions under the gates 17. Hence "transistor action" is possible only between the silicon implanted regions and is controlled by voltages applied to gates 17. The concentration of implanted silicon in the epitaxial layers should be as high as possible to achieve as low as possible resistivity for the source and drain regions. The implant of silicon ions has an energy range of 20 to 150 keV and a dose of $3 \times 10^{12}$ to $3 \times 10^{13}$ silicon ions $cm^{-2}$. An exemplary implant is a dose of $2 \times 10^{13}$ ions $cm^{-2}$ at 30 keV and then a dose of $2 \times 10^{13}$ ions $cm^{-2}$ at 120 keV. The resulting peak concentration of silicon ions in the wafer 1 before an annealing step ranges from $1 \times 10^{18}$ to $3 \times 10^{18}$ ions $cm^{-3}$. Practically, the concentration of $2 \times 10^{18}$ silicon ions $cm^{-3}$ is the upper limit. Although it is preferable for source and drain regions (not shown) of the E-HFETs and D-HFETs to be the same conductivity type as the donor layer, here N-type, the source and drain regions can be P-type by implanting other dopants, such as beryllium, as discussed above. It is preferable that the donor layer 6 be doped with the same dopant used for implanting.

Figure 7:
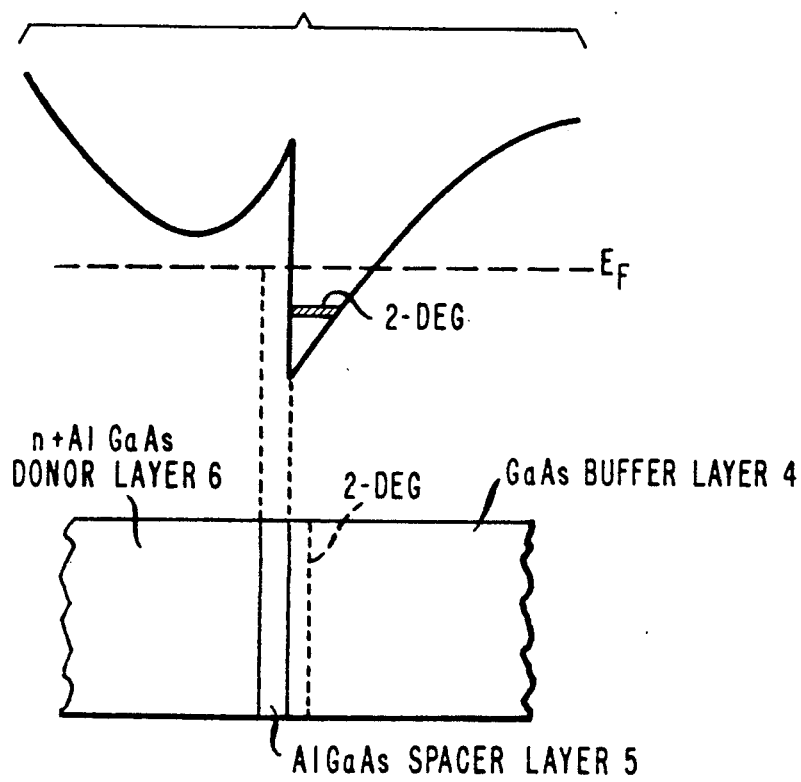
FIG. 7 is an energy diagram of the lower conduction band edge and the semiconductor layers corresponding thereto.

High temperature annealing of the structure in FIG. 6 results in the activation of the silicon implant in the layers 4–10. An exemplary annealing step is the heating of the wafer 1 to a temperature of approximately 800° C. for approximately 10 minutes in an atmosphere of arsenic at pressure of 100 milliTorr or greater, preferably with a capping layer (not shown) of silicon dioxide ($SiO_2$), silicon oxynitride ($SiO_xN_y$) or silicon nitride ($Si_xN_y$). Alternatively, a rapid thermal anneal could be used at an exemplary temperature of 825° C. for 30 seconds. As stated, the silicon dopant in the donor layer 6 out-diffuses and converts portions of the previously undoped AlGaAs spacer layers 5, 7 into doped AlGaAs, which, for purposes here, becomes indistinguishable from the donor layer 6, i.e., those portions of the spacer layers 5,7 that absorb dopant from the donor layer 6 effectively becomes part of donor layer 6. However, as stated above, the dopant in the donor layer 6 must not reach the first cap layer 8 or the buffer layer 4. More particularly, the spacer layer 5 must have sufficient width so that the 2-DEG remains in the buffer layer 4 after the annealing of the wafer 1. As shown in FIG. 7, the layers 4, 5 and 6 are shown oriented horizontally with an energy diagram of the lower conduction band edge thereof in correspondence with the layer 4, 5 and 6. $E_F$ is the Fermi energy level of the shown structure. As shown, the width of the spacer layer 5 is critical in maintaining the 2-DEG in the proper position: in the potential well formed by the spacer layer 5 and the buffer layer 4. As discussed above, the width of the spacer layer 5 should be approximately 2.5 nanometers after annealing and have an aluminum concentration of approximately 22% for the proper confinement of the 2-DEG.

Figure 8:
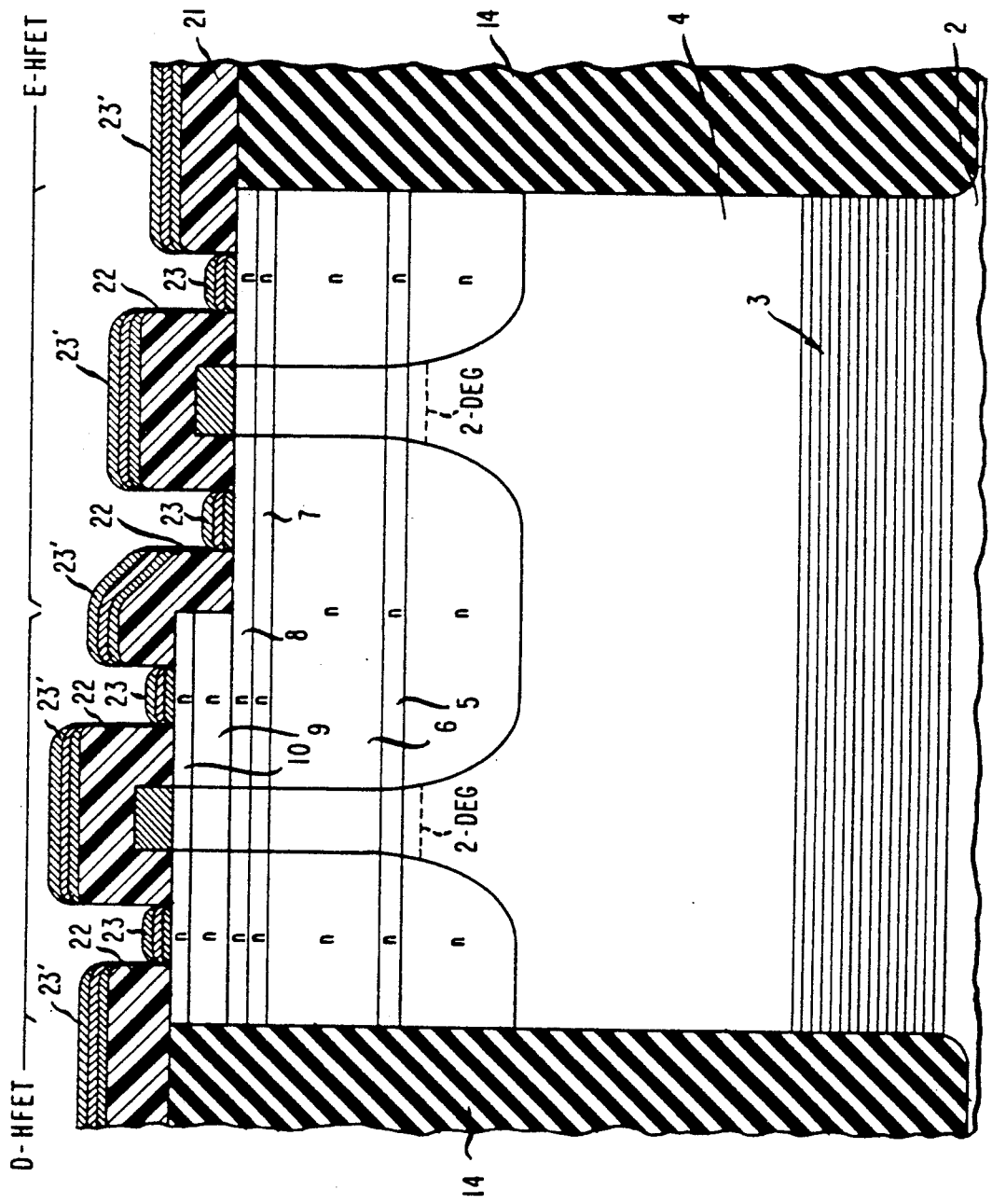
FIG. 8 is the structure of FIG. 6 with patterned photoresist and metal deposited thereon for contacting the source/drain regions.

After the high temperature anneal of the wafer 1, a second isolation implant is done, referred to here as a deep isolation implant, assuring complete isolation of the E-HFETs and D-HFETs. A photoresist 20 (FIG. 6) is deposited and patterned, resulting in substantially the same pattern as the photoresist 12 of FIG. 2. This approach allows the use of similar masks for the patterning of photoresist 20 and photoresist 12. The wafer 1 is then exposed to an implant source (not shown) which provides an isolation dopant 21, preferably the same as that used for the shallow implant, e.g., oxygen. An exemplary implant is $2 \times 10^{13}$ doubly ionized oxygen ions $cm^{-2}$ at 130 keV, resulting in a peak concentration of $5 \times 10^{17}$ to $5 \times 10^{18}$ atoms $cm^{-3}$. However, it is understood that other implants could be used such as boron, argon or hydrogen. After the deep isolation implant, the isolation region 14 now extends at least through the superlattice structure 3, as shown in FIG. 8 after removal of the photoresist 20. This deep isolation implant removes virtually all possible low conductivity paths between HFETs separated by the isolation regions 14. The wafer 1 is then annealed in an atmosphere of helium or nitrogen at exemplary 500° C. for 10 minutes or by rapid thermal anneal at an exemplary temperature of 550° C. for 30 seconds.

Contacting the drain and source regions requires ohmic contacts to the surface adjacent portions of the doped first and second cap layers 8, 10. In FIG. 8, a photoresist 22 is deposited and patterned to expose the first and second cap layers 8, 10 where the contacts are to be formed. An exemplary first layer of a gold and germanium alloy is deposited either mixed together or in thin alternating sub-layers. Then an exemplary layer of nickel and lastly an exemplary layer of gold are deposited, all the layers collectively labeled here as 23, 23'. The first layer of gold:germanium alloy assures an ohmic contact to the doped GaAs first and second cap layers 8, 10. Other metals and alloys can be used as the ohmic contacts to doped GaAs, such as gold:germanium/silver/gold or nickel/gold:germanium/gold. The unwanted metal 23' is removed by "lifting off" the metal 23' on the photoresist 22 as the photoresist 22 is removed. As will be discussed in more detail below, if aluminum is used to interconnect devices on wafer 1, a barrier between the gold of the ohmic contacts and the aluminum is deposited as the top-most layer on the ohmic contact metal 23, such as $Wi_1Si_{0.45}$, WN or WSiN.

Figure 9:
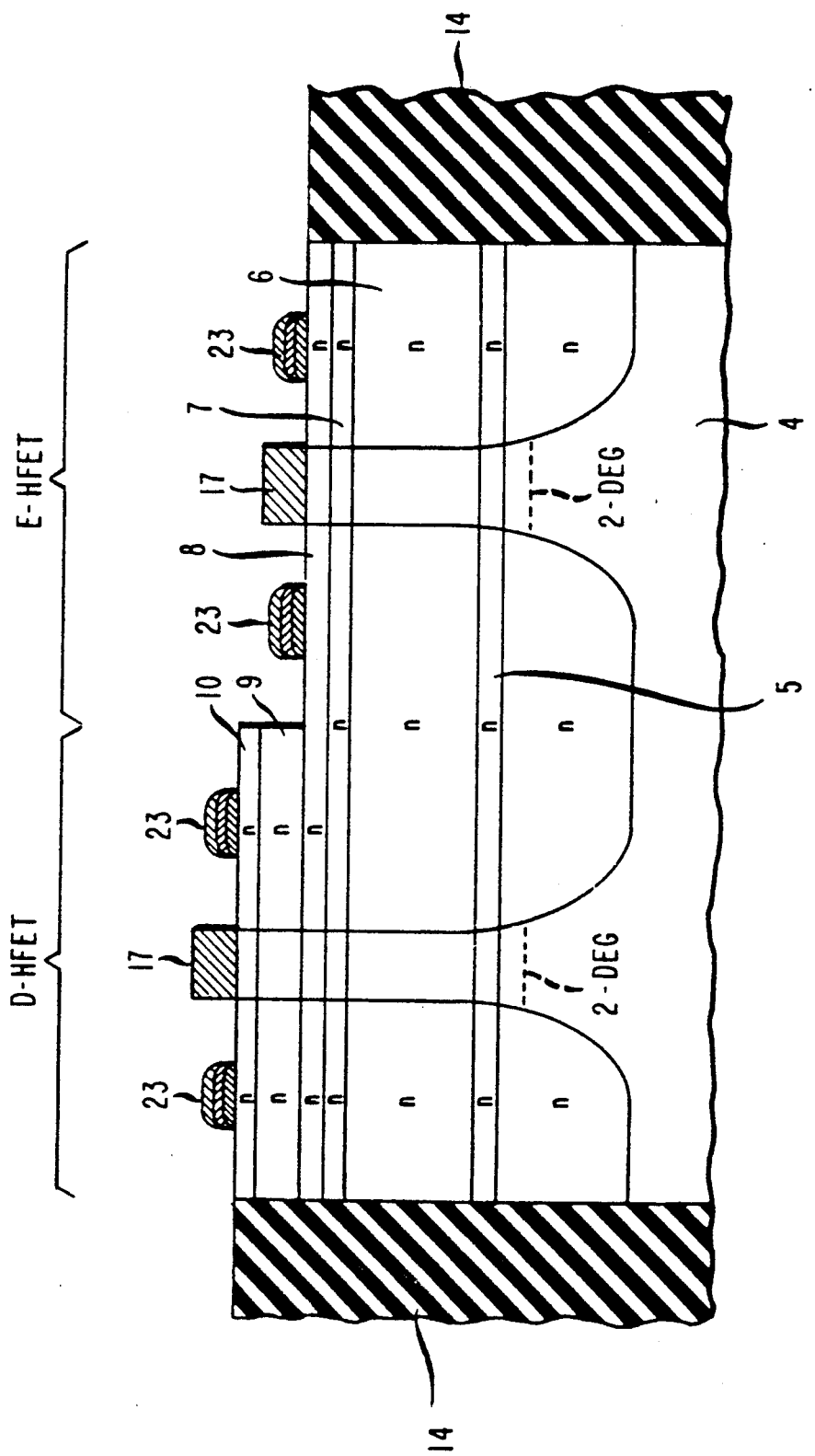
FIG. 9 is the structure of FIG. 8 with photoresist and the unmasked metal removed leaving metal contacting the source/drain regions.

After removal of the photoresist 22 and unwanted metal 23' (FIG. 8), the remaining ohmic contact metal 23 are the source and drain contacts of the E-HFETs and D-HFETs, as shown in FIG. 9. The wafer 1 is then annealed to alloy the metal ohmic contact 23 and form an ohmic contact with the underlying sources and drains. This ohmic anneal is a low temperature anneal of 350°–450° C. for 10 to 60 seconds in an atmosphere of helium or nitrogen.

Figure 10:
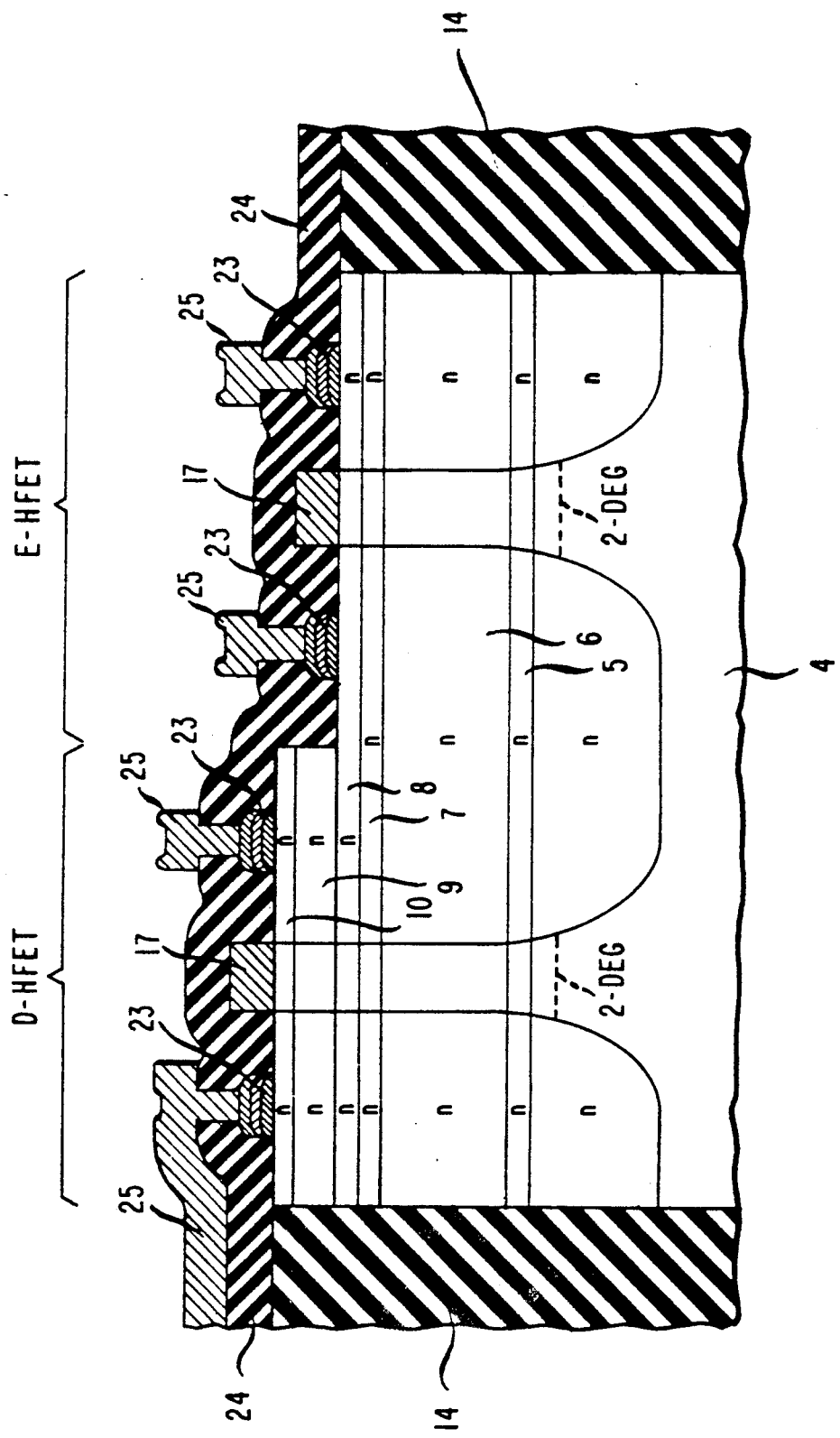
FIG. 10 is the structure of FIG. 9 with a first dielectric layer and first metalization layer thereon; and, FIG. 11 is the completed structure of FIG. 10 with a second dielectric layer, second metalization layer and a passivation layer thereon.

It is noted that the deep isolation implant, discussed above, can occur after the deposition of the ohmic contacts metal 23, thereby combining the annealing steps for both the ohmic contact metals 23 and the deep isolation implant. After the ohmic anneal, a first insulating layer 24, typically silicon dioxide ($SiO_2$) or silicon oxynitride ($SiO_xN_y$), is deposited as shown in FIG. 10, preferably by plasma assisted chemical vapor deposition (PCVD). A photoresist (not shown) is deposited and patterned to expose the first insulating layer 24 where windows, or vias, to underlying metal are desired, such as the drain and source contact metal 23 or the gates 17. The first insulating layer is then etched with a conventional anisotropic etch, such as a dry etch using $SF_6$, $NF_3$, or $CF_4$. The photoresist (not shown) is then removed, the wafer 1 cleaned and a first metalization interconnect layer 25 is deposited. The first metalization interconnect layer 25 is preferably aluminum but gold (using a lift-off technique) could be used as metal 22. As discussed above, with aluminum metalization, the thin barrier layer of $W_1Si_{0.45}$ deposited on the ohmic contact metal 23 is used to prevent aluminum/gold interaction. A photoresist (not shown) is then deposited and patterned, leaving the metal interconnect layer 25 exposed where it is to be removed. The metal interconnect layer 25 is then etched and the photoresist (not shown) is removed, leaving the structure substantially as shown in FIG. 10. The first metal interconnect layer 25 is shown contacting the drain or source contacts of the exemplary E-HFETs and D-HFET in FIG. 10.

To assist in planarizing the final structure, the first insulating layer 24 may be optionally deposited very thickly, e.g. 800 nanometers, and etched back to form an essentially planar surface. The photoresist (not shown) is then deposited and patterned as described above.

Figure 11:
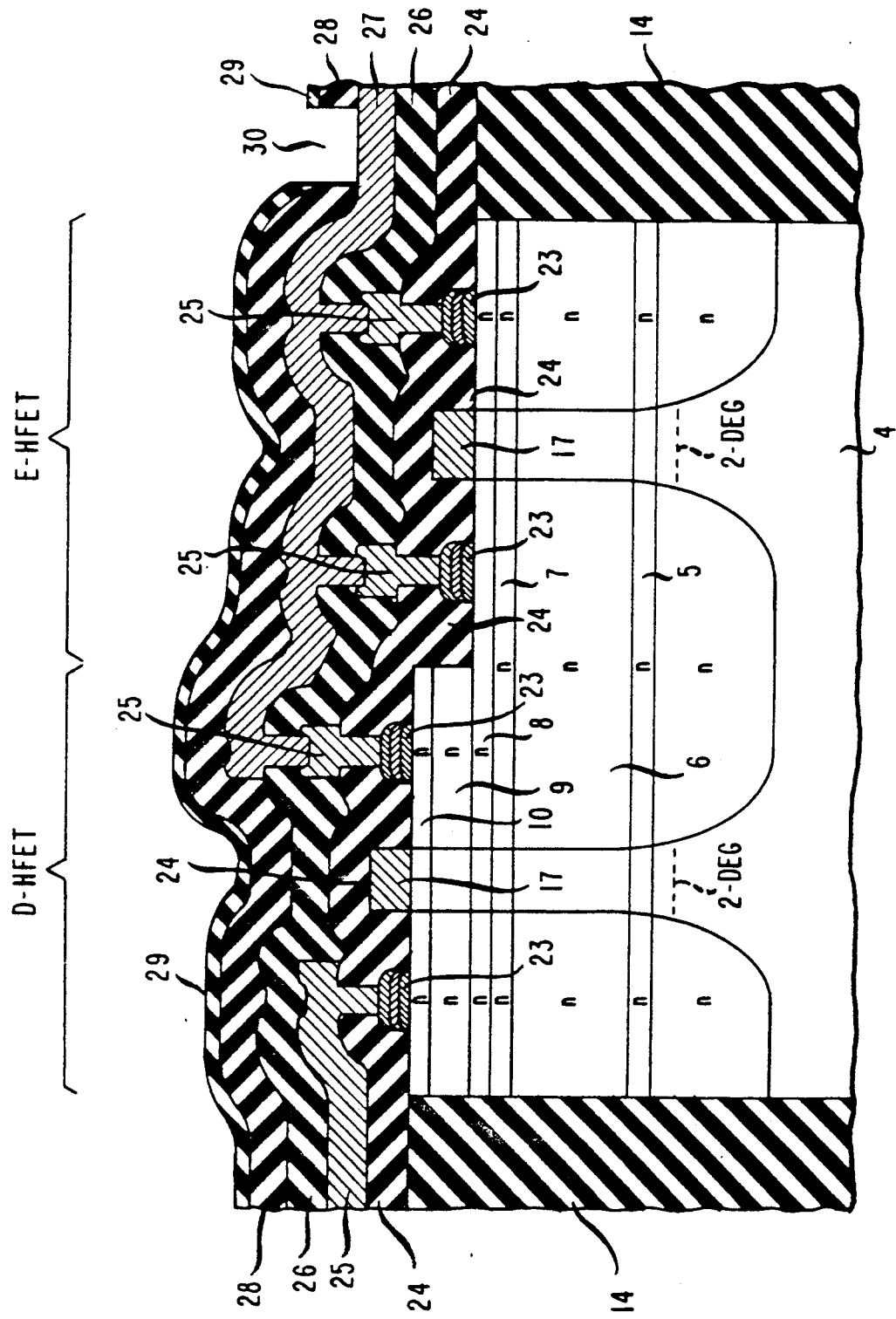

A second insulating layer 26 is deposited over the first metalization interconnect layer 25 and the first insulating layer 24 as shown in FIG. 11. The insulating layer 26 is similar to the composition of the first insulating layer 24. A photoresist layer (not shown) is deposited and patterned to expose windows in the second insulating layer 26 where windows, or vias, are to be formed for contacting underlying first metal interconnect layer 25. The second insulating layer 26 is then etched with a conventional anisotropic etch as described above. The photoresist (not shown) is then removed and a second metalization interconnect layer 27 is deposited. Another photoresist (not shown) is then deposited over the second metal interconnect layer 27 and patterned for removal of unwanted metal interconnect 27. The metal interconnect 27 is then etched and the photoresist (not shown) is removed. The second metal interconnect layer 27 is shown in FIG. 11 as contacting source and drain contacts of both exemplary E-HFET and D-HFET via the first level metal interconnect layer 25. The second level metal interconnect layer 27 (and any subsequent level of metal) is preferably of the same compositon as the first level metal interconnect layer 25.

Although only two layers of interconnect metal 25, 27 are shown, other metal interconnect layers can be added to the structure shown in FIG. 11. Over the last metal layer, here layer 27, another insulating layer 28 and then a passivation layer 29 is deposited to protect the completed circuit from contamination. The passivation layer 29 is preferably silicon nitride ($Si_3N_4$) or $SiO_xN_y$. The layers 28, 29 has deposited thereon a photoresist which is patterned to expose the layers 28, 29 where windows are to be formed for allowing bonding of external conductors (not shown) to the circuit. The layers 28, 29 are etched by a conventional anisotropic etch and the photoresist (not shown) is removed, leaving windows therein to the underlying metal interconnect layer 27 for bonding pads and completing the wafer 1.

It is noted that the thicknesses of all the layers 4–10 and 24–29 are not to scale in all the figures. In particular, the combined thickness of layers 9 and 10 is approximately 50 nanometers, which is very small compared to the typical thickness of the first metal layer 25 (500 to 1000 nanometers), making the entire structure of FIG. 9 substantially planar.

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

What is claimed is:

1. A method for making compound semiconductor integrated circuits, Characterized By The Steps Of:

growing a buffer layer of compound semiconductor material with a first bandgap energy;

growing a donor layer of doped compound semiconductor material with a second bandgap energy;

growing a first cap layer of compound semiconductor material with the first bandgap energy;

growing an etch-stop layer of compound semiconductor material with a third bandgap energy; and growing a second cap layer of compound semiconductor with the first bandgap energy;

wherein the second and third bandgap energies are greater than the first bandgap energy;

2. The method for making compound semiconductors recited in claim 1, Further Characterized By The Step Of:

growing a first spacer layer of compound semiconductor material with the second bandgap energy; and, growing a second spacer layer of compound semiconductor material with the second bandgap energy;

wherein the first spacer layer is disposed between the buffer layer and the donor layer and the second spacer layer is disposed between the donor layer and the first cap layer.

3. The method for making compound semiconductors recited in claim 2, Further Characterized By The Step Of:

growing on a substrate a superlattice structure of alternating layers of compound semiconductor material with first and fourth bandgap energies;

wherein the buffer layer is grown on the superlattice, and the fourth bandgap energy is greater than the first bandgap energy.

4. The method for making compound semiconductors recited in claim 2, Further Characterized By The Step Of:

growing a protective layer of compound semiconductor material with the third bandgap energy;

wherein the protective layer is grown on the second cap layer.

5. The method for making compound semiconductors recited in claim 4, Further Characterized By The Steps Of:

selectively etching the protective layer where an E-HFET is to be formed;

etching the exposed second cap layer to expose the etch-stop layer;

etching the exposed etch-stop layer and the remaining protective layer to expose the major surface of the first cap layer and the second cap layer, respectively;

depositing gate metal; and selectively etching the gate metal to form gates for E-HFETs and D-HFETs on the major surfaces of the first and second cap layers, respectively.

6. The method for making compound semiconductors recited in claim 5, wherein the third bandgap energy is greater than the first bandgap energy.

7. The method for making compound semiconductors recited in claim 6, wherein the thicknesses of the protective layer and the second cap layer are substantially the same.

8. The method for making compound semiconductors recited in claim 7, Further Characterized By The Step Of:
selectively implanting an isolation dopant to form isolation regions.

9. The method for making compound semiconductors recited in claim 8, Further Characterized By The Step Of:
annealing the wafer.

10. The method for making compound semiconductors recited in claim 9, wherein the layers are grown by a molecular beam epitaxy process.

11. The method for making compound semiconductors recited in claim 9, wherein the layers are grown by metal-organic chemical vapor deposition.

12. The method for making compound semiconductors recited in claim 9,
wherein the compound semiconductor material with the first bandgap energy is GaAs and the compound semiconductor material having the second, third and fourth bandgap energies are AlGaAs; and,
wherein the concentration of the aluminum in the AlGaAs determines the bandgap energy therein.

13. The method for making compound semiconductors recited in claim 12, wherein the concentration of aluminum is 60% or less.

14. A method for making compound semiconductor integrated circuits on a substrate comprising the steps of:
A. growing an epitaxial layer of a predetermined thickness on the substrate;
B. isolating selected regions of the epitaxial layer;
C. etching portions of the epitaxial layer to a predetermined depth where enhancement FETs are to be formed;
D. forming gate electrodes for both enhancement and depletion of FETs;
E. forming source/drain regions for the drain and source electrodes of the enhancement and depletion FETs;
F. contacting the source/drain regions;
G. depositing a dielectric layer;
H. selectively etching the dielectric layer for vias;
I. forming a interconnect layer; and,
J. passivating the resulting structure;
wherein the step of growing an epitaxial layers further comprises the steps of:
forming a buffer sub-layer of undoped compound semiconductor with a first bandgap energy;
forming a spacer sub-layer of undoped compound semiconductor with a second bandgap energy;
forming a donor sub-layer of doped compound semiconductor with the second bandgap energy;
forming a first cap sub-layer of undoped compound semiconductor with first bandgap energy;
forming an etch-stop sub-layer of undoped compound semiconductor with a third bandgap energy; and,
forming a second cap sub-layer of undoped compound semiconductor with the first bandgap energy;
wherein the second and third bandgap energies are greater than the first bandgap energy.

15. The method recited in claim 14, wherein the steps of G, H and I are repeated for each desired layer of interconnect.

16. The method recited in claim 15, further comprising the step of:
forming a superlattice structure of alternating sub-layers of undoped compound semiconductors with the first and a fourth bandgap energies;
wherein the fourth bandgap energy is greater than the first bandgap energy.

17. The method recited in claim 15, wherein the etching of the selected regions of the epitaxial layer where E-HFETs are to be formed stops substantially at the boundary between the etch-stop sub-layer and the second cap sub-layer.

18. The method recited in claim 17, wherein the etching of the selected regions of the epitaxial layer where enhancement FETs are to be formed is by selective reactive ion etching.

19. The method recited in claim 17, the step of forming the gate electrodes comprising the steps of:
depositing refractory metal;
depositing photoresist;
patterning the photoresist; and,
etching the photoresist and the refractory metal.

20. The method recited in claim 19, wherein the etching of the photoresist and the refractory metal is by reactive ion etching.

21. The method recited in claim 20, wherein the refractory metal is a silicide of tungsten or a nitride of tungsten.

22. The method recited in claim 17, the step of forming the source/drain regions comprising the steps of:
depositing photoresist;
patterning the photoresist as to leave exposed the areas of the epitaxial layer where the drain and source electrodes of the enhancement and depletion FETs are to be formed;
implanting dopant species into the exposed areas; and,
annealing the epitaxial layer.

23. The method recited in claim 17, wherein the third bandgap energy is greater than the second bandgap energy.

24. The method recited in claim 23, wherein the compound semiconductor with the first bandgap energy is GaAs and the compound semiconductor with the second, third and fourth bandgap energies is AlGaAs; wherein the bandgap energy is determined by the concentration of aluminum in the AlGaAs and the aluminum concentration is 60% or less.

25. The method recited in claim 24, wherein the doping is silicon.

26. The method recited in claim 17, the contacting of the source/drain regions comprising the steps of:
depositing photoresist;
patterning the photoresist as to leave windows on the source/drain regions where an ohmic contact is to occur;
depositing metal;
etching the metal to leave metal remaining in the windows; and,
annealing the remaining metal.

27. The method recited in claim 26, wherein the annealing is by rapid thermal annealing.

28. The method recited in claim 15, the step of isolating selected regions of the epitaxial layer comprising the steps of:

depositing photoresist;

patterning the photoresist to remove portions thereof over the selected regions of the epitaxial layer;

implanting an isolation dopant in the exposed epitaxial layer; and, annealing the epitaxial layer.

29. The method recited in claim 15, the step of selective etching of the dielectric layers comprises the steps of:

depositing photoresist over the corresponding dielectric layer;

patterning the photoresist; and, etching the exposed dielectric layer.

30. The method recited in claim 15, the step of passivation the structure comprising the steps of:

depositing a passivation layer;

depositing photoresist;

patterning the photoresist as to leave windows over bonding pads; and, etching the passivation layer in the windows.

31. The method recited in claim 30, wherein the passivation layer is silicon nitride or silicon oxynitride on silicon dioxide and the etching of the passivation layer is by reactive ion etching.

* * * * *